United States Patent [19]

Yoon

[11] Patent Number: 5,572,117
[45] Date of Patent: Nov. 5, 1996

[54] MULTI-METER

[75] Inventor: Hee Y. Yoon, Kyungsangbook-Do, Rep. of Korea

[73] Assignee: Goldstar Electron Co., Ltd., Choongchungbook-do, Rep. of Korea

[21] Appl. No.: 304,900

[22] Filed: Sep. 13, 1994

[30] Foreign Application Priority Data

Sep. 16, 1993 [KR] Rep. of Korea ............... 18688/1993

[51] Int. Cl.⁶ .................................. G01R 15/08
[52] U.S. Cl. .............................. 324/115; 324/133
[58] Field of Search .................... 324/115, 765, 324/122, 96, 133, 73.1

[56] References Cited

U.S. PATENT DOCUMENTS

| | | | |
|---|---|---|---|
| 3,390,329 | 6/1968 | Gewirtz | 324/115 |
| 3,961,256 | 6/1976 | Gaskell et al. | 324/122 |
| 4,020,414 | 4/1977 | Paredes | 324/122 |
| 4,028,616 | 7/1977 | Stevens | 324/115 |
| 4,092,591 | 5/1978 | Lozowksi | 324/96 |
| 4,296,375 | 10/1981 | Takezaki | 324/133 |
| 4,321,543 | 3/1982 | Tuska | 324/133 |
| 4,743,842 | 5/1988 | Langone et al. | 324/133 |

Primary Examiner—Ernest F. Karlsen
Attorney, Agent, or Firm—Lowe, Price, LeBlanc & Becker

[57] ABSTRACT

A multi-meter comprising a switch for selecting an object and a range of a thing to be measured, a display unit for displaying a value measured according to the object and the range selected by the switch, a measurement circuit including a Z-state measurement unit to measure a Z-state of the thing to be measured, in addition to the object to be measured, the Z-state being an unknown state, and a controller for controlling the switch, the display unit and the measurement circuit. The Z-state measurement unit includes a light emitting circuit having first and second light emitting diodes. The first light emitting diode is turned on when the thing to be measured is not at the Z-state and the second light emitting diode is turned on when the thing to be measured is at the Z-state.

7 Claims, 3 Drawing Sheets

MULTI-METER

BACKGROUND OF THE INVENTION

1. Field of the Invention

The present invention relates in general to multi-meters, and more particularly to a multi-meter which is capable of measuring a Z-state of an output signal from a thing to be measured, in addition to high and low states thereof, the Z-state being an unknown state unrelated to the high and low states.

2. Description of the Prior Art

Multi-meters are generally classified into two types, a digital type and an analog type.

Referring to FIG. 1, there is shown a perspective view illustrating schematically a construction of a conventional multi-meter of the analog type. In this drawing, the conventional multi-meter of the analog type is designated by the reference numeral 1. As shown in this drawing, the conventional multi-meter 1 of the analog type comprises a body 2, a switch 3 disposed on a lower front portion of the body 2 to select an object and a range to be measured, probes 4 connected to the body 2 through cables 5, and an indicator 6 disposed on an upper front portion of the body 2 to indicate a scale on a scale board corresponding to a measured value.

Also, objects to be measured such as, for example, direct current (DC) current and voltage, an alternating current (AC) voltage, a resistance ($\Omega$) and etc. and ranges thereof to be measured are indicated on the front of the body 2 surrounding the switch 3.

FIG. 2 is a perspective view illustrating schematically a construction of a conventional multi-meter of the digital type, which is designated by the reference numeral 11 in the drawing. As shown in this drawing, the conventional multi-meter 11 of the digital type comprises a body 12, a switch 13 disposed on a lower front portion of the body 12 to select an object and a range to be measured, probes 14 connected to the body 12 through cables 15, and a display unit 16 disposed on an upper front portion of the body 12 to display a numerical value corresponding to a measured value.

The objects to be measured such as the DC current and voltage, the AC voltage, the resistance ($\Omega$) and etc. and the ranges thereof to be measured are also indicated on the front of the body 12 surrounding the switch 13.

The operations of the multi-meters of the analog and digital types with the above-mentioned constructions will hereinafter be described with reference to FIGS. 1 and 2.

First, in the case where the user operates the switch 3 of the multi-meter 1 of the analog type to select an object and a range to be measured and then brings the probes 4 into contact with a desired position of a thing to be measured, a hand of the indicator 6 indicates a scale on the scale board corresponding to a measured value. Then, the user recognizes the measured value by reading the scale indicated by the hand of the indicator 6.

On the other hand, in the case where the user operates the switch 13 of the multi-meter 11 of the digital type to select an object and a range to be measured and then brings the probes 14 into contact with a desired position of a thing to be measured, the display unit 16 displays a numerical value corresponding to a measured value. Then, the user recognizes the measured value directly from the numerical value displayed on the display unit 16.

By the way, the above-mentioned conventional multi-meter of the digital type is generally constructed to measure only two level states, high and low states of an output signal from the thing to be measured, such as, for example, an integrated circuit. For this reason, in the case where the integrated circuit outputs a signal of a Z-state as well as the high and low states, the above-mentioned conventional multi-meter of the digital type cannot measure the Z-state. As a result, an output characteristic of the integrated circuit cannot be accurately grasped.

SUMMARY OF THE INVENTION

Therefore, the present invention has been made in view of the above problem, and it is an object of the present invention to provide a multi-meter which is capable of measuring a Z-state of an output signal from a thing to be measured, in addition to high and low states thereof.

In accordance with the present invention, the above and other objects can be accomplished by a provision of a multi-meter comprising switching means for selecting an object and a range of a thing to be measured; display means for displaying a value measured according to the object and the range selected by said switching means; measurement means including Z-state measurement means to measure a Z-state of the thing to be measured, in addition to said object to be measured, the Z-state being an unknown state; and control means for controlling said switching means, said display means and said measurement means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
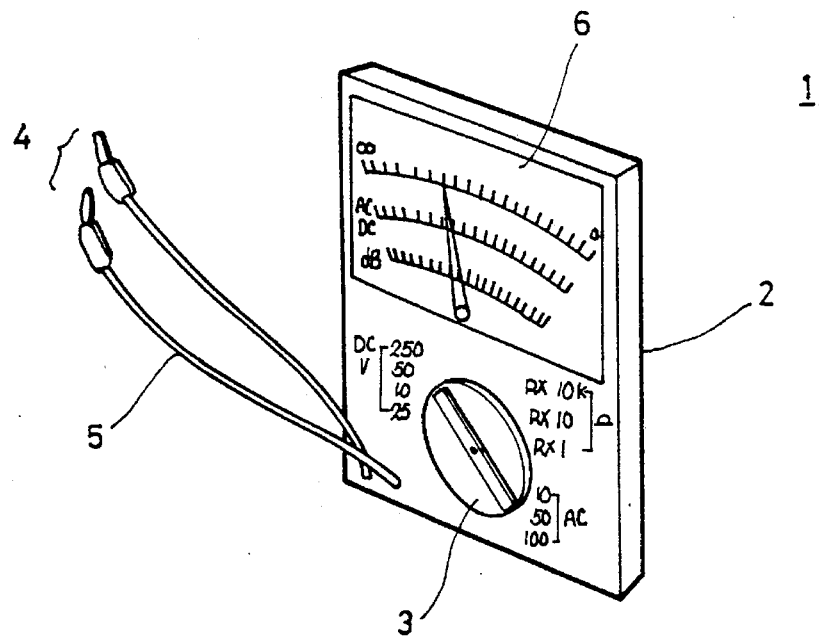
FIG. 1 is a perspective view illustrating schematically a construction of a conventional multi-meter of an analog type.
Figure 2:
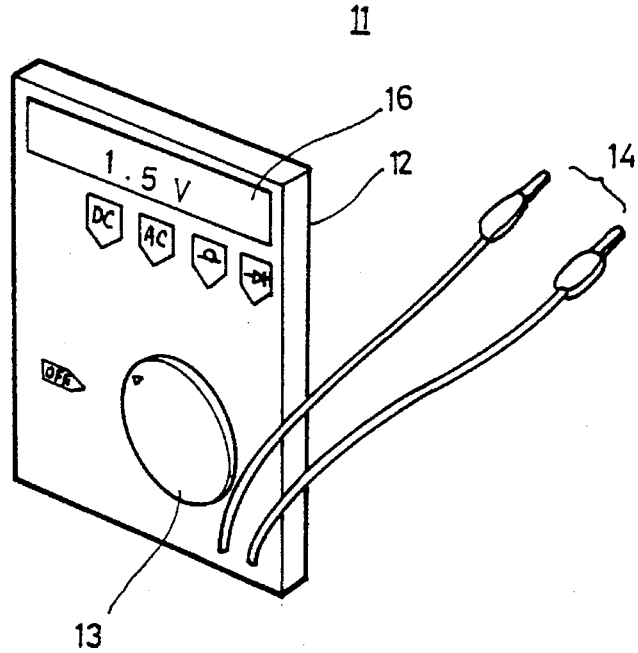
FIG. 2 is a perspective view illustrating schematically a construction of a conventional multi-meter of a digital type.
Figure 3:
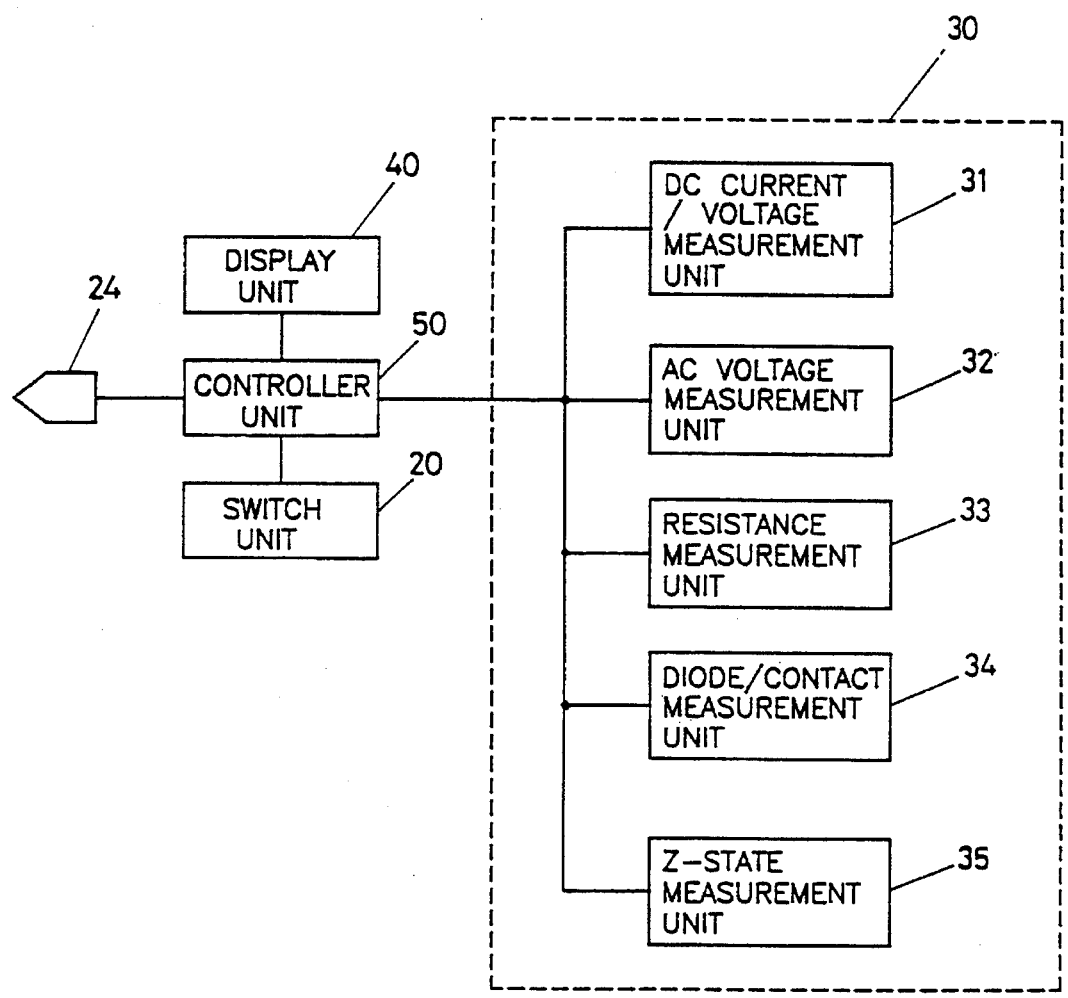
FIG. 3 is a block diagram of a multi-meter of the present invention.

Referring to FIG. 3, there is shown a block diagram of a multi-meter of the present invention. As shown in this drawing, the multi-meter of the present invention comprises a switch 20 for selecting an object and a range of a thing to be measured, and a measurement circuit 30 for measuring the object selected by the switch 20 through a probe 24 and a cable (not shown) connected to the probe 24. The probe 24 comes into direct contact with a desired position of the thing to be measured.

Also, the multi-meter of the present invention comprises a display unit 40 for displaying numerically a measured value from the measurement circuit 30, and a controller 50 for controlling the switch 20, the measurement circuit 30 and the display unit 40.

The measurement circuit 30 includes a DC current/voltage measurement unit 31 for measuring DC current and voltage of the thing to be measured, an AC voltage measurement unit 32 for measuring an AC voltage of the thing to be measured, a resistance measurement unit 33 for measuring a resistance of the thing to be measured, a diode/contact measurement unit 34 for measuring a constant voltage characteristic of a diode as the thing to be measured, to check whether the diode is at a normal state or not, and measuring a contact state of the thing to be measured, and a Z-state measurement unit 35 for measuring a Z-state of the thing to be measured.

Figure 4:
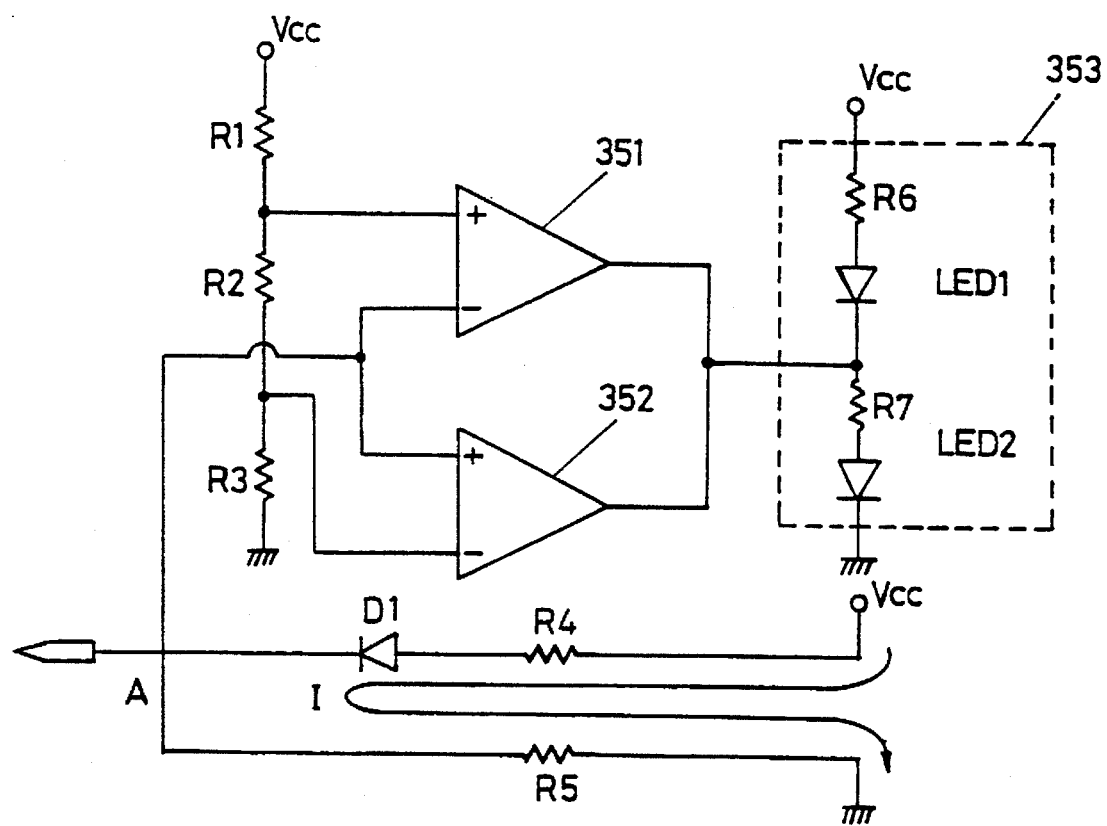
FIG. 4 is a detailed circuit diagram of a Z-state measurement unit in FIG. 3.

Referring to FIG. 4, there is shown a detailed circuit diagram of the Z-state measurement unit 35 in FIG. 3. As shown in this drawing, the Z-state measurement unit 35 includes a diode D1 having an anode connected to a power source voltage Vcc through a resistor R4 and a cathode connected to the probe 24 and through a resistor R5 to a ground. Resistors R1, R2 and R3 are connected in series between the power source voltage Vcc and the ground to divide the power source voltage Vcc. A first comparator 351 inputs a voltage at a connection point between the resistors R1 and R2 at its non-inverting input terminal (+) and a measured voltage from the probe 24 at its inverting input terminal (−) and compares the inputted voltages with each other. A second comparator 352 inputs a voltage at a connection point between the resistors R2 and R3 at its inverting input terminal (−) and the measured voltage from the probe 24 at its non-inverting input terminal (+) and compares the inputted voltages with each other. A light emitting circuit 353 is connected to a common output terminal of the first and second comparators 351 and 352 to indicate the Z-state of the thing to be measured, in response to output signals from the first and second comparators 351 and 352.

The light emitting circuit 353 includes a first light emitting diode LED1 having an anode connected to the power source voltage Vcc through a resistor R6 and a cathode connected to the common output terminal of the first and second comparators 351 and 352, and a second light emitting diode LED2 having an anode connected to the common output terminal of the first and second comparators 351 and 352 through a resistor R7 and a cathode connected to the ground.

The operation of the multi-meter with the above-mentioned construction in accordance with the present invention, more particularly the operation of the Z-state measurement unit 35 will hereinafter be described in detail.

First, in the case where an integrated circuit (not shown) as the thing to be measured is at the Z-state which is an unknown state, the external power source voltage Vcc is applied through the resistor R1 and the forward diode D1 to the probe 24 connected to the integrated circuit, thereby causing a voltage VA at a connection point A between the probe 24 and the diode D1 to be set to a desired value. In this case, a current I flows sequentially through the resistor R4, the forward diode D1 and the resistor R5.

Therefore, the voltage VA can be obtained on the basis of the following equation (1):

$$VA = Vcc - (I \times R4 + 0.7 V + I \times R5) \quad (1)$$

The power source voltage Vcc of, for example, 3 V may be applied to the probe 24 connected to the integrated circuit so that the voltage VA can become 1.5 V. The voltage VA of 1.5 V is applied to the inverting input terminal (−) of the first comparator 351 and the non-inverting input terminal (+) of the second comparator 352. The power source voltage Vcc of 3 V is equally divided by the resistors R1, R2 and R3, which have the same resistance. As a result, a voltage of 2 V is applied to the non-inverting input terminal (+) of the first comparator 351 and a voltage of 1 V is applied to the inverting input terminal (−) of the second comparator 352.

Then, the first comparator 351 outputs a high signal because the voltage of 2 V inputted at its non-inverting input terminal (+) is higher than the voltage of 1.5 V inputted at its inverting input terminal (−). Also, the second comparator 352 outputs a high signal because the voltage of 1.5 V inputted at its non-inverting input terminal (+) is higher than the voltage of 1 V inputted at its inverting input terminal (−).

Subsequently, in the light emitting circuit 353, the first light emitting diode LED1 is turned off, whereas the second light emitting diode LED2 is turned on. Therefore, it is ascertained that the integrated circuit as the thing to be measured is at the Z-state.

On the other hand, if the integrated circuit as the thing to be measured is not at the Z-state, it will output either a high signal or a low signal.

In the case where the integrated circuit as the thing to be measured outputs the high signal of, for example, 5 V, the voltage VA becomes a high state of 5 V although the power source voltage Vcc is applied to the probe 24 connected to the integrated circuit. The voltage VA of 5 V is applied to the inverting input terminal (−) of the first comparator 351 and the non-inverting input terminal (+) of the second comparator 352. The power source voltage Vcc of 3 V is equally divided by the resistors R1, R2 and R3 of the same resistance. As a result, the voltage of 2 V is applied to the non-inverting input terminal (+) of the first comparator 351 and the voltage of 1 V is applied to the inverting input terminal (−) of the second comparator 352.

Then, the first comparator 351 outputs a low signal because the voltage of 2 V inputted at its non-inverting input terminal (+) is lower than the voltage of 5 V inputted at its inverting input terminal (−). The second comparator 352 outputs a high signal because the voltage of 5 V inputted at its non-inverting input terminal (+) is higher than the voltage of 1 V inputted at its inverting input terminal (−).

By the way, in the case where the integrated circuit as the thing to be measured outputs the low signal of, for example, 0.4 V, the voltage VA becomes a low state of 0.4 V although the power source voltage Vcc is applied to the probe 24 connected to the integrated circuit. The voltage VA of 0.4 V is applied to the inverting input terminal (−) of the first comparator 351 and the non-inverting input terminal (+) of the second comparator 352. The power source voltage Vcc of 3 V is equally divided by the resistors R1, R2 and R3 of the same resistance. As a result, the voltage of 2 V is applied to the non-inverting input terminal (+) of the first comparator 351 and the voltage of 1 V is applied to the inverting input terminal (−) of the second comparator 352.

The first comparator 351 outputs a high signal because the voltage of 2 V inputted at its non-inverting input terminal (+) is higher than the voltage of 0.4 V inputted at its inverting input terminal (−). The second comparator 352 outputs a low signal because the voltage of 0.4 V inputted at its non-inverting input terminal (+) is lower than the voltage of 1 V inputted at its inverting input terminal (−).

In result, in the case where the integrated circuit as the thing to be measured is not at the Z-state and outputs either the high signal or the low signal, any one of the first and second comparators 351 and 352 outputs the low signal, thereby causing the first light emitting dime LED1 to be turned on, whereas the second light emitting dime LED2 to be turned off.

As apparent from the above description, according to the present invention, the multi-meter further has the function capable of measuring simply the Z-state of the thing to be measured, by applying the power source voltage thereto, in addition to the conventional function.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-meter comprising:

switching means for selecting one object of a plurality of measurement objects and one of a plurality of ranges of values for said one object to be measured between a test probe and an electrical ground;

display means for displaying a value measured for said object;

Z-state measurement means selectable by said switching means to measure a Z-state with a probe, in addition to said objects, at a point contacted by said probe, the Z-state being unknown; and control means for controlling said switching means, said display means and said measurement means to selectively determine the Z-state at the probe contact point.

2. A multi-meter as set forth in claim 1, wherein said Z-state measurement means includes:

a diode having an anode connected to a power source voltage through a first resistor and a cathode connected to a probe and through a second resistor to a ground, said probe being connected to the point to be measured;

third to fifth resistors connected in series between the power source voltage and the ground to divide the power source voltage;

a first comparator for inputting a voltage at a connection point between said third and fourth resistors at its non-inverting input terminal and a measured voltage from said probe at its inverting input terminal and comparing the inputted voltages with each other;

a second comparator for inputting a voltage at a connection point between said fourth and fifth resistors at its inverting input terminal and the measured voltage from said probe at its non-inverting input terminal and comparing the inputted voltages with each other; and light emitting means connected to a common output terminal of said first and second comparators to indicate the Z-state of the thing to be measured, in response to output signals from said first and second comparators.

3. A multi-meter as set forth in claim 2, wherein said light emitting means includes:

a first light emitting diode having an anode connected to the power source voltage through a sixth resistor and a cathode connected to the common output terminal of said first and second comparators; and a second light emitting diode having an anode connected to the common output terminal of said first and second comparators through a seventh resistor and a cathode connected to the ground.

4. A multi-meter as set forth in claim 3, wherein said first light emitting diode is turned on when the point to be measured is not at the Z-state and said second light emitting diode is turned on when the point to be measured is at the Z-state.

5. A multi-meter comprising:

a switch for selecting one of a plurality of measurement objects for measurement, including a Z-state object, and one of a plurality of ranges of values for said one of a plurality of measurement objects, for measurement by a test probe, a display, connected to said switch for selectively displaying a value of said measurement object from said test probe, and a second display for indicating High/Low or Z-state logic conditions at the test probe.

6. A multi-meter in accordance with claim 5 further comprising:

a series connection of a first resistor, a diode, and a second resistor between a voltage source and ground with said test probe connected to the junction of said diode and said second resistor.

7. A multi-meter in accordance with claim 5 in which:

said second display includes two light emitting diodes in series between a voltage source and ground and comparator means connected between said test probe and a point between said light emitting diodes.

* * * * *